(12) United States Patent
Zhang et al.

(10) Patent No.: US 7,446,046 B2
(45) Date of Patent: Nov. 4, 2008

(54) SELECTIVE POLISH FOR FABRICATING ELECTRONIC DEVICES

(75) Inventors: Liming Zhang, San Jose, CA (US); Uday Mahajan, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 337 days.

(21) Appl. No.: 11/031,086

(22) Filed: Jan. 6, 2005

(65) Prior Publication Data

US 2006/0148260 A1    Jul. 6, 2006

(51) Int. Cl.
*H01L 21/302* (2006.01)
(52) U.S. Cl. ........................ 438/692; 438/693; 438/756; 51/307
(58) Field of Classification Search ................. 438/692, 438/693, 753, 756; 257/618; 51/307
See application file for complete search history.

(56) References Cited

U.S. PATENT DOCUMENTS

| | | | |
|---|---|---|---|
| 5,173,439 A * | 12/1992 | Dash et al. | 438/424 |
| 5,229,316 A * | 7/1993 | Lee et al. | 438/424 |
| 5,996,594 A * | 12/1999 | Roy et al. | 134/1.3 |
| 6,174,820 B1 * | 1/2001 | Habermehl et al. | 438/745 |
| 6,234,815 B1 * | 5/2001 | Omiya et al. | 439/191 |
| 6,265,292 B1 | 7/2001 | Parat et al. | |
| 6,855,607 B2 * | 2/2005 | Achuthan et al. | 438/283 |
| 2004/0140288 A1 * | 7/2004 | Patel et al. | 216/2 |

OTHER PUBLICATIONS

Braun, Alexander E., "Copper Moves CMP to Center Stage," Semiconductor International, Dec. 1, 1999, http://www.reed-electronics.com/.

Fazio, et al., "ETOX™ Flash Memory Technology: Scaling and Integration Challenges," Intel® Technology Journal, Semiconductor Technology and, no copy submitted.

* cited by examiner

*Primary Examiner*—Carl Whitehead, Jr.
*Assistant Examiner*—Colleen E Rodgers
(74) *Attorney, Agent, or Firm*—Schwabe, Williamson & Wyatt, P.C.

(57) ABSTRACT

A selective polish for fabricating electronic devices is disclosed. The selective polish may include the use of a slurry that facilitates the selective polish of a first component but does not substantially polish a second component.

10 Claims, 5 Drawing Sheets

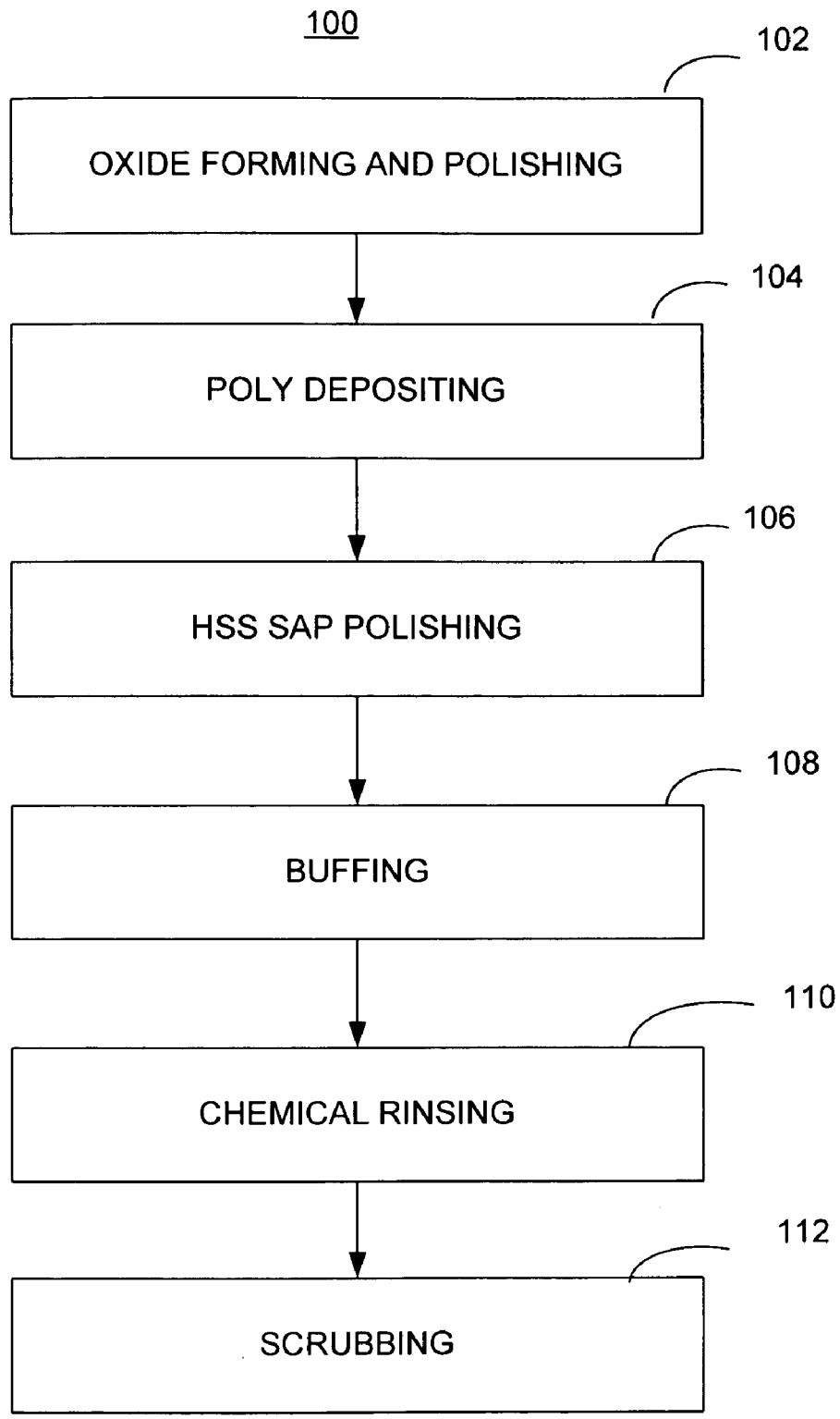

SELECTIVE POLISH FOR FABRICATING ELECTRONIC DEVICES

BACKGROUND OF THE INVENTION

1. Field of the Invention

Embodiments of the present invention relate to, but are not limited to, electronic devices and, in particular, to the field of electronic device manufacturing.

2. Description of Related Art

In the current state of electronics, horizontal die shrinkage has proceeded at a relentless pace, fueled by, in some instances, roughly ⅓ pitch reduction per generation. By contrast, vertical shrinkage has progressed much more slowly due to various reasons. One obstacle that has impeded vertical shrinkage is the shortcomings associated with various fabrication operations, for example, polishing operations.

For instance, in the field of flash memory devices, several polishing operations may be performed during the fabrication process. Each of the polishing operations is typically directed to planarizing or smoothing specific component or components on the silicon substrate. Unfortunately, because the silicon substrates are often characterized by a widely varied topography that includes different components made of different materials at varying concentrations, efficiently polishing these surfaces is often difficult.

For example, the silicon substrates used to form the foundation for these flash memory devices will typically be embedded with numerous isolation trenches (e.g., shallow trench isolation) that dot the landscape of the substrate at varying concentrations. The isolation trenches are typically made of oxides. The concentration level of the isolation trenches in a particular region will depend on whether the region is dedicated to, for example, flash memory arrays or other structures. The silicon substrate may also include other components of varying concentration including poly components such as poly-1 or floating gates for the flash memory cells. The combination of having multiple components made of different materials at varying concentrations on the substrate surfaces make polishing of these surfaces difficult to control.

Other factors that prevent some of the polishing operations from being an efficient means of planarizing the surfaces of the silicon substrates are the limitations of one or more of the polishing processes. For example, in flash memory fabrication, two of the polishing operations performed may include shallow trench isolation (STI) and self-aligned poly (SAP) polish operations. These polishing operations are primarily performed in order to polish or planarize specific components. For example, the general goal of the STI polish is to polish oxide pillars used to form shallow trench isolation (STI) while the general goal of the SAP polish is to polish poly-1 (floating gate).

Although each of the polishing processes is intended to polish specific components (e.g., STI polish for polishing oxide and SAP for polishing poly-1 or floating gates), the limited selectivity of one or more of these conventional polishing processes may prevent the processes from polishing only their intended component. To illustrate, in a typical SAP polishing process, both poly as well as oxide materials are typically removed.

As a result of these various factors, the ability to produce high quality poly components, such as poly-1, with a high yield is often difficult, particularly as the size of the devices (e.g., flash memory devices) continues to shrink. If the polish of poly-1 is overdone with a conventional process, the poly film and the oxide pillar may be too thin to protect the device from pitting. On the other hand, if the polish of poly-1 is insufficient, there may be excess poly remaining on top of oxide, which may result in shorting or leakage of the device.

Forming poly components with a smooth surface is generally an important factor in forming a defect free thin vertical profile memory device. For instance, when conventional polishing methods (e.g., conventional SAP polish) are used for polishing poly components, they will produce poly components with surface roughness having root mean square (RMS) values of about 5 Å or greater. Because of this surface roughness, the ability to form defect free components on top of the rough surface (e.g., thin silicon oxide/nitride and poly-2 on top of the poly-1) will be compromised particularly as device sizes continue to shrink.

In addition to the problem of surface roughness, other limitations of conventional polish processes include, for example, the presence of microscratches and polish residue on the surface of the silicon substrate after these processes have been completed. The presence of these defects may further limit the manufacturing yields of the overall fabrication process.

BRIEF DESCRIPTION OF DRAWINGS

The present invention will be described by way of exemplary embodiments, but not limitations, illustrated in the accompanying drawings in which like references denote similar elements, and in which:

FIG. 1 illustrates a process that includes a high-selectivity slurry self-aligned poly (HSS SAP) polish operation for fabricating electronic devices in accordance with some embodiments; note—please see comment about FIGS. 2A and 2B.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

According to various embodiments, a highly selective polish process may be performed on a substrate such as a silicon wafer in order to polish a first component without substantially polishing or removing a second component. For these embodiments, the highly selective polish may be a selective poly polish that polishes poly components without substantially removing oxide components. In some embodiments, a selective slurry may be employed during the selective poly polish process. The selective slurry may facilitate the polishing of poly components such as, for example, the poly-1 or floating gate of a flash memory cell, at a substantially higher rate than oxide components such as those that make up, for example, shallow trench isolation (STI). For purposes of this description, this selective poly polish process may be referred to as high selective slurry (HSS) self-aligned poly polish or HSS SAP. In various embodiments, the poly/oxide selectivity of the HSS SAP polish may be greater than or equal to 5 to 1 (5:1). In one embodiment, the poly/oxide selectivity may be equal to or greater than 50 to 1 (50:1).

In addition to the HSS SAP polish, additional processes may be performed. For example, in some embodiments, a buff operation may be performed in combination with the HSS SAP polish in order to increase surface smoothness, reduce microscratches and to remove slurry residue from the poly components and/or the wafer surface.

In some embodiments the selective slurry may include a conventional slurry such as silicon dioxide in a solution of basic pH. In addition, an oxide retarding additive such as tetra-methyl-ammonium hydroxide (TMAH), benzyltrimethylammonium hydroxide (BTMAH), EDP solution [ethylenediamine (NH2(CH2)2NH2)+pyrocatechol] (C6H4(OH)2)+water+pyrazine (C4H4N2)], KOH/IPA [KOH+isopropyl alcohol], and/or other oxide-retarding additive may be added to the slurry.

Figure 2A:
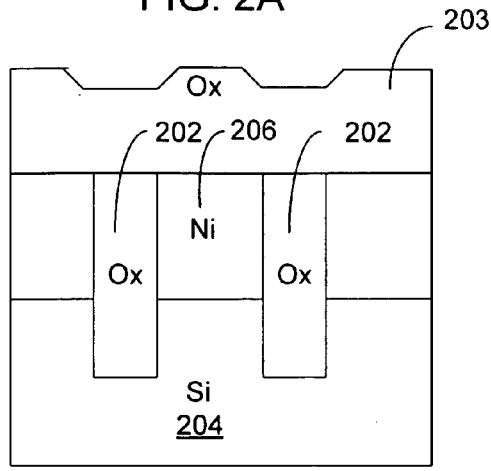
FIGS. 2A and 2B illustrate oxide pillars formed on a substrate in accordance with some embodiments; note—this is after STI polish. Before STI polish, there is oxide everywhere, including on top of nitride. These 2 figures may need to be redrawn. One example is below.
Figure 2B:
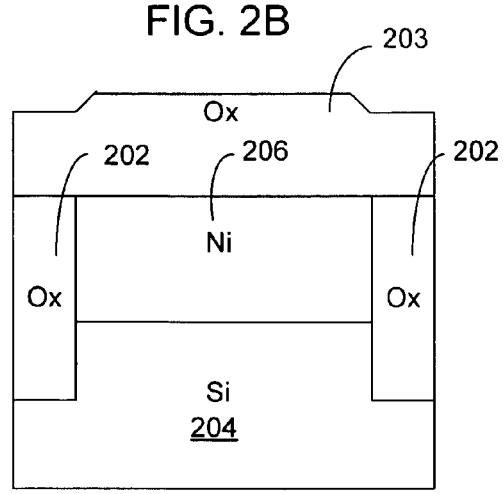

FIG. 1 depicts a process that includes a selective polish operation that may be utilized for fabricating an electronic device in accordance with various embodiments of the invention. In some embodiments, the process 100 may be employed to form a substantially defect free poly-1 or floating gate of a flash memory device. The process 100 may begin when oxide pillars are formed and polished on the surface of a substrate such as a silicon wafer substrate at block 102. FIGS. 2A and 2B depict oxide pillars 202 that have been formed on a silicon substrate 204 by depositing oxide material into a patterned nitride layer 206 that is on top of the silicon substrate 204. In particular, FIG. 2A depicts oxide pillars 202 in high density regions such as those that contain flash memory arrays while FIG. 2B depicts oxide pillars 202 in low density regions. Note that on top of the nitride layer 206 is excess oxide material 203

Figure 3A:
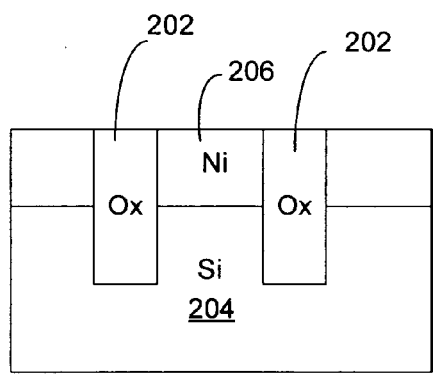
FIGS. 3A and 3B illustrate the substrate of FIGS. 2A and 2B after the oxide pillars have been planarized in accordance with some embodiments.
Figure 3B:
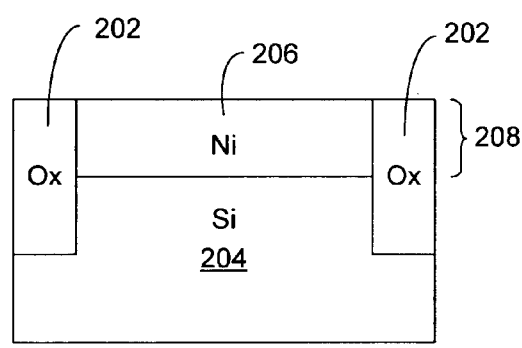

The oxide pillars 202 may be formed in the nitride layer 206 using a process similar to a damascene process. In this process, a thin layer of pad oxide (not shown) may first be formed on a clean silicon surface (e.g., silicon substrate 204). A thick layer of chemical-vapor deposition (CVD) nitride (e.g., nitride layer 206) may then be deposited on top of the pad oxide. The nitride layer 206 is then patterned and trenches are anisotropically etched into the silicon substrate 204. After resist stripping, the trench sidewalls may be passivated with a thin layer of thermal oxide. The trenches are then filled with a thick CVD oxide and subsequently planarized using shallow trench isolation (STI) polish process such as chemical-mechanical polishing (CMP). The STI polish may result in the planarization and the removal of some nitride and oxide materials from the top of the nitride layer 206 and the oxide pillar 202 as depicted in FIGS. 3A and 3B.

The use of a subsequent HSS SAP polishing process (e.g., see block 106 in FIG. 1) in various embodiments may allow reduction in the minimum oxide budget of the oxide pillars 202. That is, in conventional fabrication processes in which a conventional SAP process is performed, there is a substantial minimum oxide budget for the oxide pillars 202. For example, when a conventional SAP polish process is employed for the fabrication of node flash memory cell, the initial oxide pillar height (as indicated by ref. 208 may have a height of about 1100 angstroms (Å). This large initial oxide budget may be required in order to compensate for foreseeable loss that may be incurred when the conventional poly polish process is used. In order to form oxide pillars of such height, a thick nitride layer may be required. However, when an HSS SAP polish is employed, the initial oxide budget may be reduced. For example, in some embodiments, the initial oxide pillar height may be only about 800 angstroms (Å) when fabricating the same node flash memory cell.

Figure 4A:
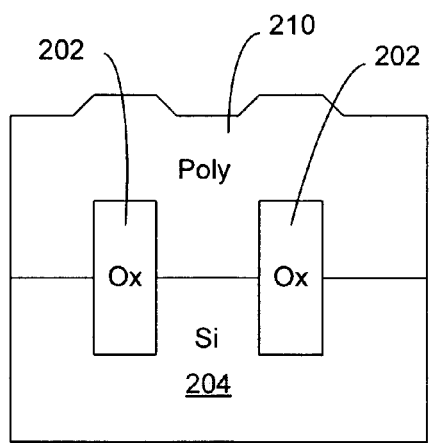
FIGS. 4A and 4B illustrate the substrate of FIGS. 2A and 2B after a poly layer has been deposited in accordance with some embodiments.
Figure 4B:
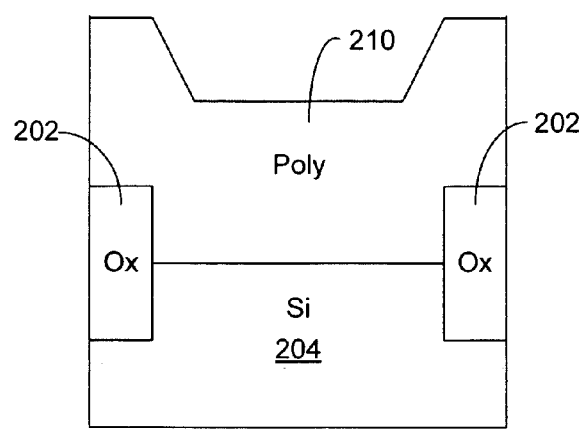

Once the oxide pillars 202 are formed, the nitride layer 206 and the oxide pad may be removed. After removing the nitride layer 206, a poly layer 210 such as those used to form, for example, poly-1 or floating gate, may be deposited onto the silicon substrate 204 at block 104 (see FIGS. 4A and 4B). The poly layer 210 will be initially deposited on top of both the silicon substrate 204 and the oxide pillars 202.

Figure 5A:
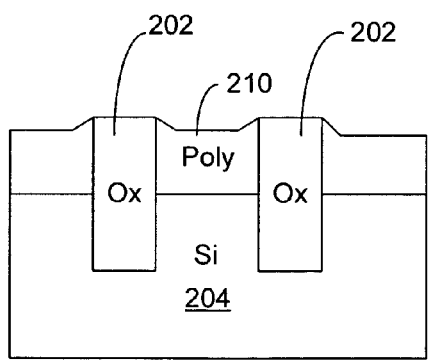
FIGS. 5A and 5B illustrate the substrate of FIGS. 2A and 2B after an HSS SAP polish operation has been performed on the substrate in accordance with some embodiments.
Figure 5B:
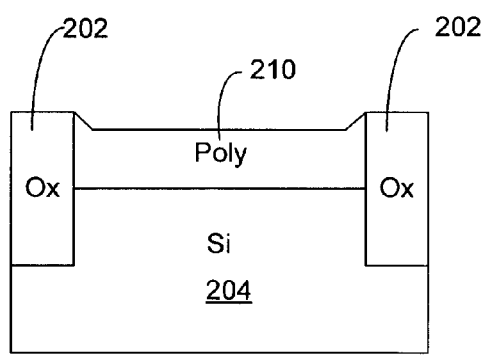

After depositing the poly layer 210, a highly selective poly polish may be performed at block 106 that results in a silicon substrate 204 with a poly layer 210 having a very smooth surface (see FIGS. 5A and 5B). In various embodiments, the highly selective poly polish may be an HSS SAP polish. In this operation, excess poly material on top of the oxide pillars 202 may be removed without substantially removing oxide materials from the oxide pillars 202. The process may include the use of an alkaline slurry containing small silica (e.g., colloidal or fumed, less than 60 nanometers (nm) in diameter) particles as material removal agent. In addition, the slurry may contain an additive such as tetra-methyl-ammonium hydroxide (TMAH), which may enhance the removal of poly materials, such those that comprise the poly layer 210, but may hinder the removal of oxide materials, such as those that comprise the oxide pillars 202. In alternative embodiments, other oxide retarding additives may be employed such as benzyltrimethylammonium hydroxide (BTMAH), EDP solution [ethylenediamine (NH2(CH2)2NH2)+pyrocatechol] (C6H4(OH)2)+water+pyrazine (C4H4N2)], KOH/IPA [KOH+isopropyl alcohol], and/or other oxide-retarding additive.

The poly/oxide selectivity of the highly selective poly polish process in various embodiments may be greater than or equal to 5 to 1 (5:1). This means that the removal rate per unit of time of the poly material as opposed to the oxide material using, for example, a CMP polishing pad, may be equal to or greater than 5 to 1 (5:1). In one embodiment, the selectivity is greater than or equal to about 50 to 1 (50:1). During the poly polishing operation, the HSS polish process may self-stop once the underlying oxide (e.g., oxide pillar 202) is exposed, such as in regions of high oxide density (e.g., those regions containing flash memory arrays). For larger poly structures, such as those found in low density regions, the HSS SAP polishing process will still be slowed down due to the support from neighboring exposed oxides. In some embodiments, control over the HSS SAP polishing process may be achieved by using an in-situ optical end point detector.

By employing a highly selective poly polishing process such as HSS SAP polish, several beneficial results may be obtained. For example, depending upon the process conditions including rotational speed, pressure, and the property of the polish pads used, these benefits include, lower within-wafer and within-die nonuniformity in terms of thickness of poly (e.g., poly-1 or floating gate surface). The high selectivity to oxide may also result in a lower level of defects on the poly film and oxide pillars.

A buffing operation may be performed at block 108 in accordance with some embodiments. The buffing may be performed in order to, among other things, reduce surface roughness, reduce microscratches and to facilitate the removal of slurry residue. The buff operation may involve another slurry (in basic pH) and a softer pad than the one used during the HSS SAP polishing operation. The slurry composition and chemistry may be engineered such that the removal rate of poly material (e.g., poly-1) is relatively low such as 200 Å/minute as measured on blanket poly while the oxide removal rate may be made close to zero. In some embodiments, an organic additive in the buff slurry may keep the particles dispersed in the slurry and to reduce the removal rate of the oxide and/or poly materials. As a result of the buffing, the poly surface may be made very smooth, with a surface roughness close to that of virgin single crystal silicon. Microscratches and slurry residue that may cause electrical shorts and/or opens may also be reduced. All of these defects (e.g., surface roughness, microscratches and slurry residue) may be detrimental by forming small crevices that may lead to non-uniform subsequent deposition of dielectric silicon oxide/nitride and poly-2, and by acting as bridging defects that can lead to electrical shorts or opens in later processing.

A chemical rinse process at block 110 may be performed by dipping the silicon substrate 204 in, for example, a tank of basic solution that includes hydrogen peroxide containing cleaning chemical such as $KOH+H_2O_2+H_2O$ or $NH_4OH+H_2O_2+H_2O$ in accordance with some embodiments. The chemical rinse may help to remove the organic residue from the water surface remaining from a previous operation and to convert the poly surface from hydrophobic to a hydrophilic surface. The tank may be heated to an elevated temperature and have megasonic power applied to it. The chemical rinse process may be performed to further improve the cleanliness of the silicon substrate surface.

A scrubbing operation may be performed at block 112 in accordance with some embodiments. The scrubbing may clean and dry the silicon substrate surface in double-sided brush scrubber. An ammonium hydroxide solution may be used to facilitate the scrubbing operation.

Figure 6A:
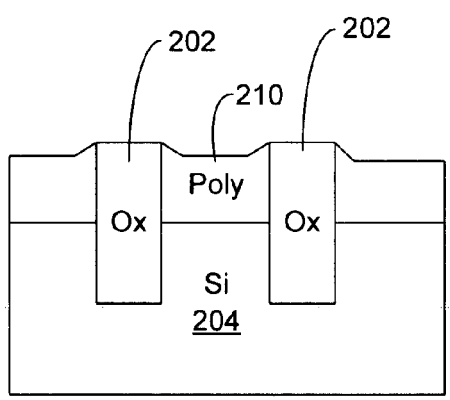
FIGS. 6A and 6B illustrate a substrate fabricated by the process of FIG. 1 in accordance with some embodiments.
Figure 6B:
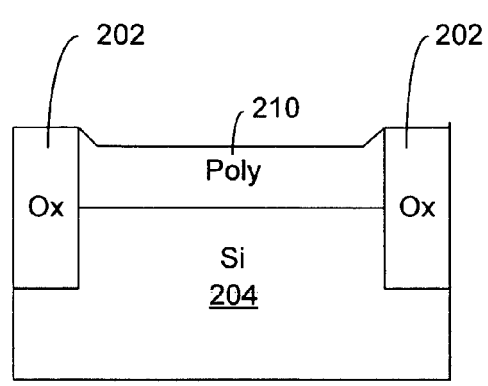

As a result of the process 100, a silicon substrate containing both poly and oxide components can be fabricated having a well controlled thickness, a very smooth surface, and with low amounts of defects as depicted in FIGS. 6A and 6B. By forming such a substrate, vertical scaling of the electronic devices (e.g., flash memory devices) to be formed using this process may be enabled.

Note that although the illustrated method depicted above relates to the fabrication of devices with flash memory arrays, in other embodiments, the process 100 may be employed for fabricating other types of devices. For example, the process 100 may be used for fabricating any device that contains both poly and oxide components such as DRAM, logic, and other devices.

Note further that in various embodiments, one or more of the blocks 102 to 112 of FIG. 1 may be eliminated from the overall process 100. Further, in some embodiments, one or more of the blocks 102 to 112 may be placed in a different sequential order than the one depicted in FIG. 1.

Figure 7:
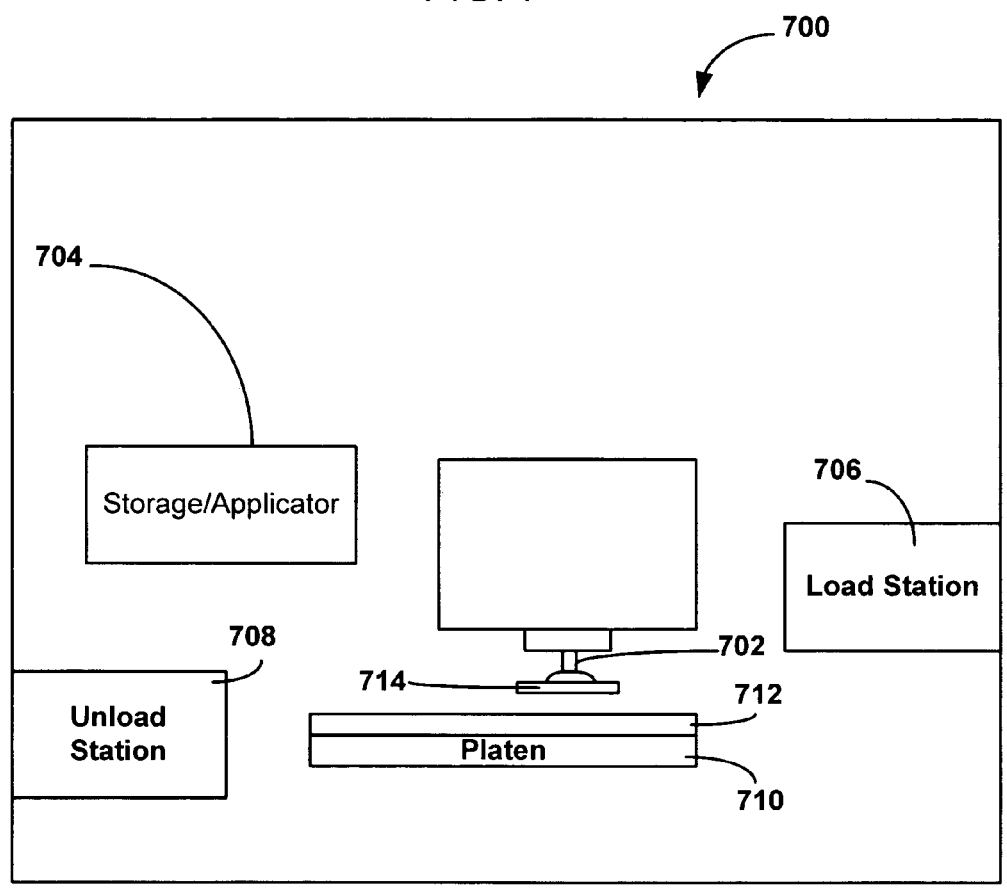
FIG. 7 illustrates a block diagram of an example system for an HSS SAP polish operation in accordance with some embodiments. Note—not sure whether this is more important, or a schematic of HSS polish explaining the interface of slurry/pad/wafer is more important. The latter is in the original IDF filed by us.

FIG. 7 is a block diagram of an exemplary polishing system that may be employed to implement an HSS SAP polish operation in accordance with some embodiments. The polishing system 700 includes, among other things, a polisher arm and wafer carrier 702 for holding a substrate 714, a slurry storage/applicator 704, a load station 706, an unload station 708, a platen 710, and a polishing pad 712. In a HSS SAP operation, a substrate 714, such as a substrate for a flash memory device, may be retrieved from the load station 706 and coupled to the polisher arm and wafer carrier 702. The slurry storage/applicator 704 may then be used to deposit a highly selective slurry, such as those described above, onto the substrate 714. The carrier 702 may then lower the substrate 714 so that it contacts the polishing pad 712 facedown. The substrate 714 is than rotated on the polishing pad 712 planarizing the substrate 714. After the completion of the selective polishing operation, the planarized substrate may be deposited into the unload station 708.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the embodiments of the present invention. Therefore, it is manifestly intended that embodiments of this invention be limited only by the claims.

What is claimed is:

1. A method, comprising:
providing a substrate, the substrate including a poly component and an oxide component; and
polishing the substrate with a slurry adapted to retard oxide removal at a poly/oxide polish rate equal to or greater than 5 to 1 (5:1), said slurry including a benzyltrimethylammonium hydroxide (BTMAH) additive.

2. The method of claim 1, wherein said substrate comprises a substrate of a flash memory device.

3. The method of claim 1, further comprising buffing the substrate, the buffing to contribute to reduction of a selected one of surface roughness, microscratches and slurry residue.

4. The method of claim 1, further comprising polishing of the oxide component prior to said polishing at a poly/oxide polish rate equal to or greater than 5 to 1 (5:1).

5. The method of claim 4, wherein said polishing of the oxide component comprises removing oxide material from an oxide pillar.

6. The method of claim 1, further comprising chemically rinsing the substrate, including exposing the substrate to a liquid containing cleaning chemicals selected from the group consisting of $KOH+H_2O_2$ and $NH4OH+H_2O_2+H_2O$.

7. The method of claim 1, further comprising scrubbing the substrate.

8. The method of claim 1, wherein said providing comprises providing a substrate including an oxide component disposed on the substrate having a height from a surface of the substrate of about 800 angstroms (Å).

9. The method of claim 1, further comprising polishing the exposed oxide component to remove a portion of the oxide component.

10. A method comprising:
providing a substrate including an oxide component disposed on the substrate, and a poly layer disposed on the substrate covering the oxide component and at least a portion of the substrate; and
polishing the poly layer to remove poly material at least until the oxide component is exposed, said polishing including polishing the poly layer with a slurry adapted to retard oxide removal at a poly/oxide polish rate equal to or greater than 5 to 1(5:1), wherein said polishing comprises polishing with a slurry having a benzyltrimethylammonium hydroxide (BTMAH) additive.

* * * * *